United States Patent [19]

Lekmine et al.

[11] Patent Number: 5,243,605
[45] Date of Patent: Sep. 7, 1993

[54] MODIFIED VITERBI DETECTOR WITH RUN-LENGTH CODE CONSTRAINT

[75] Inventors: Brahim Lekmine, Denver; Donald L. Millican, Westminster, both of Colo.

[73] Assignee: Storage Technology Corporation, Louisville, Colo.

[21] Appl. No.: 728,719

[22] Filed: Jul. 11, 1991

[51] Int. Cl.$^5$ .................................. G06F 11/10
[52] U.S. Cl. ................................. 371/43; 371/37.4; 341/59; 360/40
[58] Field of Search .............. 371/43, 37.4, 44, 72; 341/59, 106, 61; 360/40; 364/715.09

[56] References Cited

U.S. PATENT DOCUMENTS

| | | | |
|---|---|---|---|
| 4,709,377 | 11/1987 | Martinez et al. | 375/75 |
| 4,748,626 | 5/1988 | Wong | 371/30 |
| 4,761,784 | 8/1988 | Srinivasagopalan et al. | 371/43 |
| 4,786,890 | 11/1988 | Marcus et al. | 341/81 |
| 4,884,272 | 11/1989 | McConnell | 371/43 |
| 4,888,775 | 12/1989 | Karabed et al. | 371/43 |
| 4,945,538 | 7/1990 | Patel | 371/43 |
| 5,136,593 | 8/1992 | Moom et al. | 371/43 |

OTHER PUBLICATIONS

"Viterbi Detection of Class IV Partial Response on a Magnetic Recording Channel," Wood et al., IEEE Transactions on Communications, vol. Com-34, No. 5, May 1986, pp. 454-461.

"The Viterbi Algorithm," G. David Forney, Jr., Proceedings of the IEEE, vol. 61, No. 3, Mar. 1973, pp. 268-278.

"Sequence (Viterbi-Equivalent) Decoding," Schneider, IEEE Transactions on Magnetics, vol. 24, No. 6, Nov. 1986, pp. 2539-2541.

Primary Examiner—Robert W. Beausoliel, Jr.
Assistant Examiner—Ly V. Hua
Attorney, Agent, or Firm—Sheridan Ross & McIntosh

[57] ABSTRACT

A digital data decoder is provided that combines Viterbi algorithms and a run-length code constraint. The combined Viterbi detection and code constraint does not limit the bits that can be analyzed in determining the binary state of the bit currently being detected. The logic associated with the code constraint is not enabled unless actual data is being decoded.

23 Claims, 5 Drawing Sheets

FIG. 3A

MODIFIED VITERBI DETECTOR WITH RUN-LENGTH CODE CONSTRAINT

FIELD OF THE INVENTION

The present invention relates to reading data from a storage device and, in particular, to decoding data stored in a storage device using a combination of a Viterbi decoder and a run-length limited code.

BACKGROUND OF THE INVENTION

Data or other information is commonly stored using memory devices, such as disk and tape storage devices. The data is typically stored in a binary format. When it is desirable to utilize the stored data, the storage device is accessed and the data is read using, for example, magnetic or optical assemblies.

An important aspect associated with stored data relates to the need to accurately read the data. The ability to accurately read data is affected by the data storage density, i.e., the greater the density generally means the more difficult it is to accurately read the data because of, for example, the lower signal-to-noise ratio and/or storage medium defects.

It has been recognized that, for a given signal-to-noise ratio, the accuracy of the data being read can be enhanced by using a Viterbi detector or receiver. A Viterbi detector is disclosed in the publication entitled "Viterbi Detection Of Class IV Partial Response On A Magnetic Recording Channel" of Wood and Petersen in IEEE Transactions on Communications, May 1986. The Viterbi algorithm is also discussed in connection with its digital data decoding application in an article entitled "The Viterbi Algorithm" of G. David Forney, Jr. in Proceedings Of The IEEE, March 1973. Briefly, the detector implements a Viterbi algorithm in which the binary state of a detected bit is determined by using a digitized form of the analog read signal. As stated in the Wood et al. article, the Viterbi algorithm operates with a set of discrete samples and provides an iterative method of determining the "best" path along branches of a trellis. The Viterbi algorithm determines the path that is the maximum-likelihood sequence. In conjunction with that determination, along each branch of the path, a metric is calculated that corresponds to the logarithm of the probability of that being the correct branch of the path. With respect to the implementation disclosed in the Wood publication, because of the considerable hardware involved, it appears expensive to implement and can be relatively slow in operation.

A more simplified Viterbi decoder is disclosed in an article entitled "Sequence (Viterbi-Equivalent) Decoding" of Richard C. Schneider in IEEE Transactions On Magnetics, November 1988. The decoder proposed in this article is concerned with magnetic recording and utilizes an implementation that includes a combination of Viterbi detection and a run-length code constraint. Basically, the use of the Viterbi algorithm is modified by a specific run-length code constraint metric whereby substantially the same accuracy in decoding the data is sought without the hardware expense that accompanies a strict or classic Viterbi implementation. The use of run-length code constraints is well-known in connection with storing data, for example, on magnetic tapes or magnetic and optical disks. The code constraint applies to the writing or storing of data. The code constraint can be defined using (d,k), where d is the minimum number of zeroes between "1's" and k is the maximum number of "0s" between consecutive "1's". The Schneider article discloses logic or algorithms that is utilized in determining the binary state of a detected bit using the combination of a Viterbi decoder and a specific run-length code constraint, for example, (0,3). Because binary ones are typically stored on magnetic disks or tapes in accordance with an alternating polarity, this article also points out that two different sets of equations can be utilized, depending upon whether a binary one having a positive polarity (sign) or a negative polarity (sign) is the next binary one to be detected. With regard to the implementation disclosed in the Schneider publication, a determination as to the binary state of the detected bit is made utilizing the value of the detected bit, together with the values of the next three consecutively occurring bits. Consequently, in making the determination, the Schneider solution limits the number of bits that are analyzed in determining the binary state of the detected bit. Accordingly, unlike the classic Viterbi detection, the logic or algorithms disclosed in the Schneider article does not utilize bits that occur or are obtained outside of a window defined by the run-length code constraint. For example, with respect to the specific run-length code constraint (0,3), the Schneider algorithms do not analyze consecutively obtained bits that are more than three bits from the bit currently being detected.

The use of Viterbi decoders is also discussed in issued U.S. Pats. In U.S. Pat. No. 4,709,377 to Martinez et al., issued Nov. 24, 1987, and entitled "Viterbi Decoder For Wire Line Modems," a Viterbi decoder is described for use with standard modems in order to improve the signal-to-noise ratio, while reducing hardware costs. U.S. Pat. No. 4,884,272 to McConnell, issued Nov. 28, 1989, and entitled "Maximum Likelihood Diversity Receiver" discloses a receiver system that employs a decoder that implements a Viterbi algorithm that is intended to increase the accuracy of the received data. U.S. Pat. No. 4,761,784 to Srinidasagopalan et al., issued Aug. 2, 1988, and entitled "Modem And Method Using Multi-Dimensional Coded Modulation," is directed to a decoder that utilizes Viterbi detection and is intended to implement the same at reduced cost, while maintaining desired accuracy.

U.S. Pat. No. 4,748,626 to Wong, issued May 31, 1988, and entitled "Viterbi Decoder With Reduced Number of Data Move Operations," discloses a Viterbi decoder that determines a maximum likelihood path that uses a wrap-around memory in which each addressable location that is indexed to a current state of a surviving path has a previous state of that surviving path stored thereat.

SUMMARY OF THE INVENTION

In accordance with the present invention, an apparatus is disclosed that combines a Viterbi detection scheme, based on a 2-state trellis tree, with a run-length limited code, while maintaining the same performance as a true Viterbi detector. In particular, a decoder is disclosed for analyzing stored data that combines both Viterbi detection techniques and a run-length code constraint, while not limiting the bits that can be analyzed in determining the binary state of the current bit being detected.

More particularly, in conjunction with a preferred system that includes the modified Viterbi decoder, the present invention includes a data storage device that stores the data that is to be read and decoded at a suitable time. The data is stored in accordance with a predetermined code constraint. In one embodiment the code constraint is (0,3), which means that no more than three binary zeros are to be recorded between consecutive binary ones. Preferably, the data storage device is a magnetic tape or disk. The data is read from the data storage device using a magnetic reading assembly that typically includes a magnetic transducer or head. The analog signal outputted by the magnetic reading assembly is converted to a digital signal for subsequent decoding using the modified Viterbi decoder.

The modified Viterbi decoder in the present invention incorporates logic circuitry for implementing devised Viterbi algorithms and also algorithms associated with the run-length limited code. In the preferred embodiment, essentially two sets of algorithms are implemented. A first set of algorithms is implemented whenever the next binary one to be detected has a positive sign or polarity and a second set of algorithms is implemented whenever the next binary one to be detected has a negative sign or polarity. Because of the similarities between the two sets of algorithms, the modified Viterbi decoder is preferably devised in a way that includes common logic hardware that is used, regardless of whether a positive sign binary one or a negative sign binary one is next to be detected.

With respect to the decoding operation that involves a (0,3) run-length code constraint, the value of the difference and the polarity or sign associated with the difference is obtained using a first or currently being detected bit $V_p$ and a subsequently occurring bit $V_k$. Additionally, the polarity or the sign associated with the difference between the same first bit $V_p$ and each of two bits consecutively read or obtained ($V_{k+1}$, $V_{k+2}$) after the bit $V_k$ is determined. The determined magnitude and polarities, based on the calculated differences, are subsequently utilized by the modified Viterbi decoder in determining the binary state of the first bit $V_p$. Also utilized in this determination is a tracking threshold or reference $V_{TT}$. The tracking threshold is a value or magnitude that is used in determining whether or not the detected bit is a binary one or a binary zero. Preferably, the value of the tracking threshold is variable and depends upon the magnitudes of the peaks of the sampled bits currently being decoded. In making the determination concerning the binary state of the first or currently detected bit $V_p$, the bit $V_k$ is able to vary relative to its occurrence or location from the first bit $V_p$. That is, in implementing the steps of the present invention, the $V_k$ bit can be the bit obtained immediately after the $V_p$ bit, or it may be a bit that is obtained or read two or more bits after the bit $V_p$. Relatedly, the $V_{k+1}$ and $V_{k+2}$ bits would then be more than two and three bits, respectively, from the first or currently detected bit $V_p$. Accordingly, the present invention incorporates run-length code constraint logic to modify the classic Viterbi decoder, while still maintaining the true Viterbi decoder feature of being able to analyze and use bits that are obtained outside of the window associated with the run-length code constraint. In connection with the (0,3) code constraint, the modified Viterbi decoder permits use of bits that occur more than three bits after the first or currently detected bit $V_p$. Stated differently, the present invention does not require that only four consecutive bits be analyzed in determining the binary state of the currently detected bit.

In locating the data to be read and decoded, it is common place for the data storage device to use tones or other information that provide an indication of the presence of a data record. Magnetic tape includes tones or marks on the tape that inform the system that a data record is to be found after the tones or mark. The tones are data patterns that are recognizable so that a signal can be generated that indicates or represents that a data record is to follow the occurrence of the tones. Because such a data pattern is different from the data record, which incorporates a run-length code constraint, it is necessary to inhibit the logic circuitry that implements the code constraint. In one embodiment, the run-length code constraint logic is inhibited, in the absence of a run-length enable signal that is generated when a data record is being read and decoded. When non-data or other information is being read, such as tones on a magnetic tape, the run-length enable signal is not generated and, consequently, the modified Viterbi decoder acts as a true Viterbi decoder until actual data is read for decoding.

Based on the foregoing summary, a number of salient features of the present invention are readily discerned. A data decoder is provided that incorporates Viterbi algorithm while simplifying the hardware required for the implementation and thereby reducing hardware costs. This is accomplished by means of the incorporation of a run-length code constraint with the devised Viterbi algorithms. This combination preserves the features of a true Viterbi detector as the bits analyzed in determining the binary state of a detected bit are not limited by the code constraint. Consequently, there is a unique combination of enhancing the ability to accurately read data, for a given signal-to-noise ratio, while simplifying the hardware and its associated costs and still maintaining the features of a Viterbi detector. Furthermore, when the system is reading non-data information, the modified Viterbi decoder of the present invention is controlled so that it does not interfere with the proper decoding of information that does not include the code constraint.

Additional advantages of the present invention will become readily apparent from the following discussion, particularly when taken together with the accompanying drawings.

DETAILED DESCRIPTION

Figure 1:
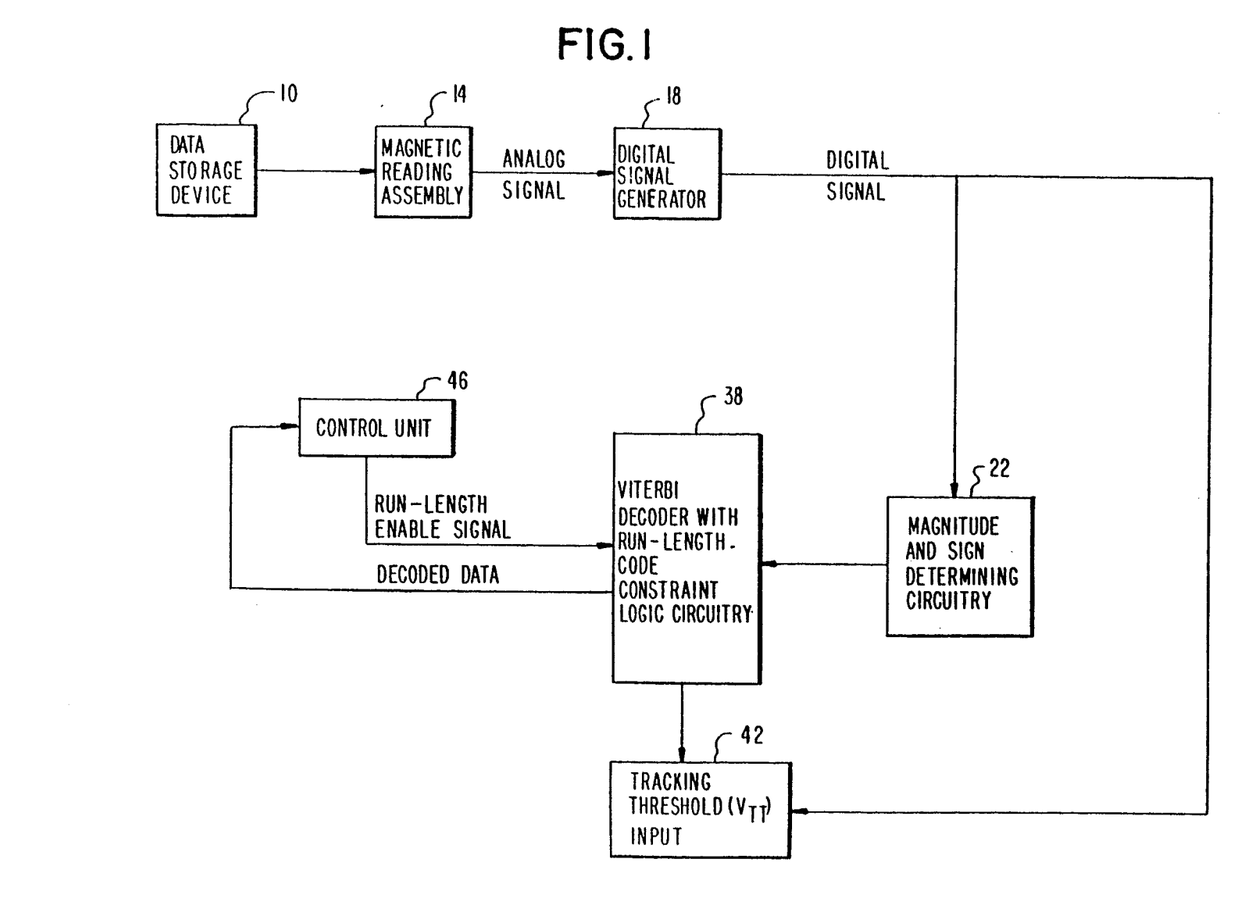
FIG. 1 is a block diagram that illustrates a system that incorporates the Viterbi detection of the present invention.

With reference to FIG. 1, an apparatus for obtaining and decoding stored data that utilizes a combination of Viterbi detection and run-length code constraint is illustrated. The apparatus generally includes a data storage device 10 for storing data. The data is typically stored by the user in a predetermined manner. The device 10 has non-data information stored thereon for providing an indication regarding the location of specific data. The present invention has particular application in connection with magnetic tapes and magnetic disks. In the case of magnetic tape, the tape typically includes tones in the form of a predetermined pattern that, when read, indicate that a data record is to follow the marks or tones. With respect to magnetic disks, a header area is provided that includes track-related information for use in identifying a particular disk track. It should be appreciated, however, that data storage devices, other than magnetic tapes and disks, could be utilized with the data decoding features of the present invention. With respect to the storing of data, binary words comprising binary bits are stored using the device 10. As is commonly done, the binary words are stored as various combinations of binary ones and binary zeros. In connection with such storage in accordance with the present invention, the data is recorded using a run-length code constraint, which can be identified generally as (d,k), where k is a predetermined value equal to the maximum number of bits of a first binary state that are found in a data record between two consecutive bits of the other binary state d. For example, the code constraint (0,3) means that generally the maximum number of "binary zeros" recorded between two consecutive "binary ones" is three. The coding of data on the data storage device 10 using such a constraint is necessary in utilizing the data decoder of the present invention.

When reading data or other information from the data storage device 10, in one embodiment in which the device 10 is a magnetic tape or disk, a magnetic reading assembly 14 is utilized. The magnetic reading assembly 14 generally includes a transducer or head for properly obtaining or converting the stored information to an electrical analog signal that accurately represents the data or other information read from the device 10. As is well known, certain hardware associated with the magnetic reading assembly 14 is controlled to be in proper alignment with desired tracks of sections of the data storage device 10 for obtaining the desired data. Such control is commonly provided by means of a controller or processor (not shown) that is hardware-controlled to locate the selected data using tones, marks or other header information.

The analog signal representing the analog read data or non-data information is outputted by the magnetic reading assembly to a digital signal generator 18. In a preferred embodiment, the digital signal generator 18 includes an analog-digital converter (ADC) for converting the inputted analog signal, or at least portions thereof, to a digital signal waveform. Preferably, the conversion of the analog signal to a digital signal is conducted using sampling techniques that result in a conversion only when a bit is being read, such as the occurrence of peaks of the analog signal. This is appropriate because the binary information stored on the data storage device 10 is analog information and its binary representations essentially correspond to the peaks of the analog signal outputted by the magnetic reading assembly 14.

Figure 2:
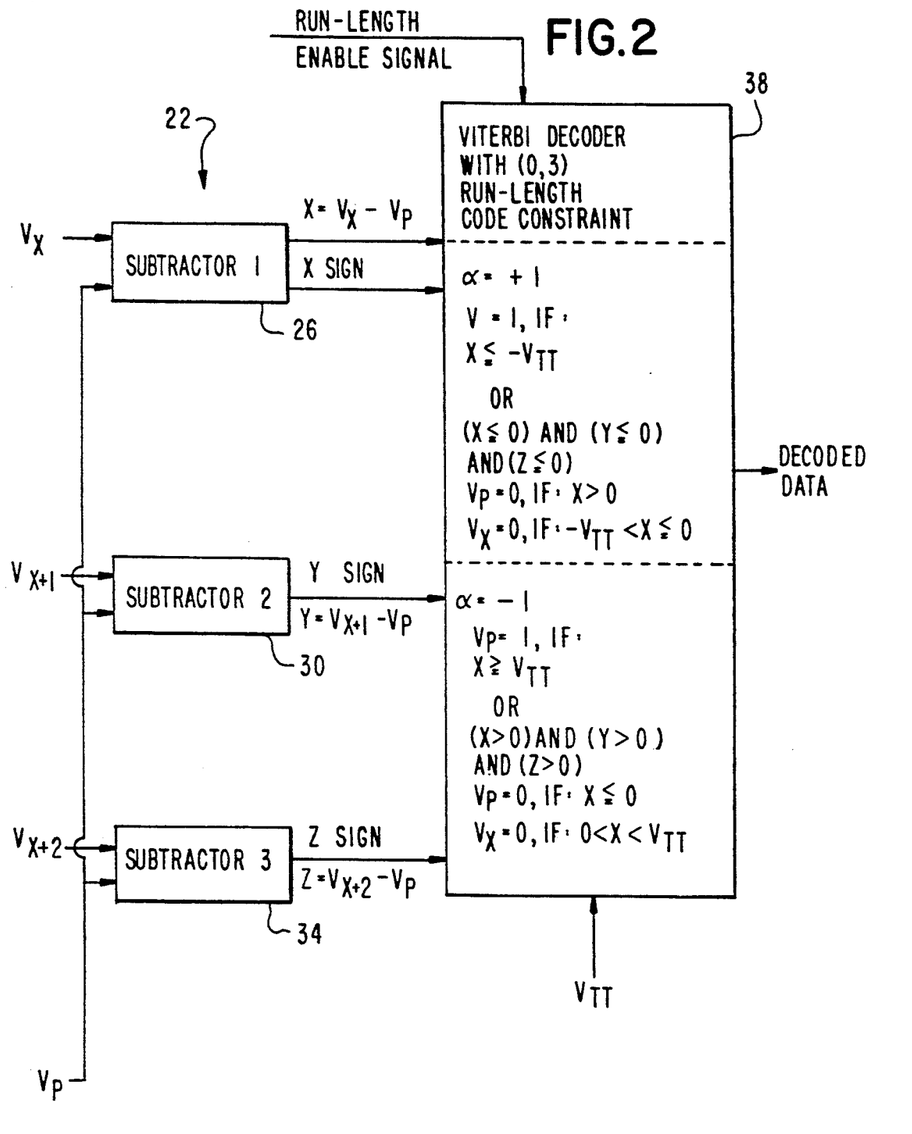
FIG. 2 is a block diagram that illustrates in more detail the circuitry for determining values utilized in the modified Viterbi decoder, together with the metrics that are implemented in the modified Viterbi decoder of the present invention.

The digital signal representing the analog data bit is inputted to magnitude and sign determining circuitry 22. The circuitry 22 is used in determining a magnitude and signs or polarities of inputted data that is required in a subsequent decoding step. In particular, the circuitry 22 receives digital binary bits that represent the voltage amplitudes of the analog read signal peaks, which are obtained from the device 10. With reference also to FIG. 2, the magnitude and sign determining circuitry 22 includes subtractor units 26, 30, 34. Each of the subtractors 26-34 receives two inputs. One of the inputs $V_p$ is common to each of the subtractors 26-34. The magnitude $V_p$, represented by an inputted digital waveform, corresponds to a currently detected bit whose binary state, a binary one or a binary zero, is to be decoded or determined. The second input to the subtractors 26-34 is different for each subtractor unit. Inputted to subtractor1, 26 is the digital signal representing the data bit having a voltage amplitude or value of $V_k$. Similarly, inputted to subtractor2 30 is the digital representation of the data bit having the voltage amplitude $V_{k+a}$. Similarly also, inputted to subtractor3 34 is the digital representation of the data bit having a voltage amplitude of $V_{k+2}$. The data bit represented by $V_k$ occurs in time or is read after the bit $V_p$. Similarly, the bit having the voltage value $V_{k+1}$ is read after the $V_p$ bit and is the next consecutive bit read after the $V_k$ bit. Likewise, the data represented by the voltage value $V_{k+2}$ is read after the $V_p$ bit and is the next consecutive bit read after the $V_{k+1}$ bit. As will be described more fully in connection with the operation of the present invention, the bit obtained from the data storage device 10 that corresponds to the $V_k$ bit may be that bit that is read consecutively after the $V_p$ bit or it may be a bit that is read more than one bit after the $V_p$ bit is read. This aspect is an important part of the present invention whereby the determination of the detected bit $V_p$ is not limited to an analysis that only involves the next consecutive bits that are read the detected bit $v_p$. It should also be appreciated that the use of data bits identified as having voltages $V_p$, $V_k$, $V_{k+1}$ and $V_{k+2}$ is based on the embodiment that implements a (0,3) code constraint. If another code constraint is utilized, the principles of the present invention can be applied but use of different or additional read and obtained binary information might be necessary. With regard to obtaining the binary bit voltage representations to conduct the necessary calculations, buffer or other holding circuits are utilized. That is, it is necessary to obtain, in accordance with the disclosed embodiment, at least four binary data bits that must be read from the device 10. Only after each of the four binary bit voltage values are obtained, can the four calculations be made by the subtractors 26-34.

Regarding the determined values for use in decoding data, each of the subtractors 26-34 has at least one output. In the case of subtractor1 26, it has two outputs. The first output is a digital representation of the value of the difference between $V_k$ and $V_p$, namely $X = V_k - V_p$. A second output provides a representation of the polarity or sign of the value X. The single output required from subtractor2 30 is a digital value representing the sign or polarity of the value Y, where $Y = V_{k+1} - V_p$. Similarly, the single output from the subtractor3 34 is a digital value representing the sign of Z, where $Z = V_{k+2} - V_p$.

Each of the X, Y, Z values is utilized in determining the binary state of the currently detected binary bit represented by $V_p$. The expression $X=V_k-V_p$ is a simplified metric associated with Viterbi analysis or detection, while the expressions $Y=V_{k+1}-V_p$ and $Z=V_{k+2}-V_p$ are metrics associated with the (0,3) run-length code constraint.

Each of the outputs from the subtractors 26-34 is applied to Viterbi decoder with run-length code constraint logic circuitry 38. The circuitry 38 uses the inputs to decode or determine the binary state of the currently detected bit $V_p$. In conducting the decoding operation, common logic gates, such as nand/and, nor/or gates, can be employed to arrive at the required determinations, based on previously derived equations or expressions. Such equations are based on Viterbi detection methods and the run-length code constraint. With respect to such equations, they are illustrated together in FIG. 2 and will next be discussed. More particularly, there are two sets of algorithms that are provided. With a first set of algorithms, the logic circuitry associated therewith is utilized when the sign of the next binary one to be detected has a positive polarity and the second set of algorithms are utilized when the next detected binary one has a negative polarity. Because of the way data is recorded on the data storage device 10, binary ones alternate in sign. That is, if a positive binary one has just been read or detected, the next binary one has a negative sign or polarity. By keeping track of the sign of the last detected binary one, the expected sign or polarity of the next binary one is known. The logic circuitry 38 implements both sets of algorithms and, because of the similarities in the two sets, common circuitry can be employed to implement both sets of algorithms.

With respect to a first set of algorithms in which the next binary one to be detected has a positive polarity ($\alpha=+1$), the logic circuitry 38 determines:

$$\text{Is } X \leq -V_{TT} \tag{1}$$

where $X=V_k-V_p$ and $V_{TT}$ is a value relating to a tracking threshold or reference. The tracking threshold $V_{TT}$ is provided by a tracking threshold unit 42. The tracking threshold 42 is a predetermined or determined voltage value that relates to the analog voltage peaks of the read data bit.

The hardware of the logic circuitry 38 also solves the following logic expression:

$$\text{Are } X \leq 0 \text{ and } Y \leq 0 \text{ and } Z \leq 0 \tag{2}$$

Where X, Y and Z have been previously defined as the values of the differences between the binary bit $V_p$ currently being determined or detected and later occurring binary bits $V_k$, $V_{k+1}$ and $V_{k+2}$, respectively. The determination involving expression (2) can be made using the sign or polarity representations for X, Y and Z received from the subtractors 26-34. If one or both expressions (1) and (2) is met or satisfied, the logic circuitry outputs an indication that the currently detected bit $V_p=1$ ($V_p$ is detected as a binary one). The logic circuitry 38 also determines:

$$\text{Is } X > 0 \tag{3}$$

If expression (3) is satisfied, then $V_p=0$ ($V_p$ is detected as a binary 0).

Lastly, the logic circuitry 38 implements the following expression using previously identified inputs:

$$\text{Is } -V_{TT} < X \leq 0 \tag{4}$$

If expression (4) is satisfied, then the binary bit presently identified as $V_k=0$.

Referring to expression (2), this is derived from the metrics associated with the run-length code constraint for (0,3). The remaining expressions (1), (3) and (4) are Viterbi-based or derived algorithms.

The algorithms, for the case where the next binary one to be detected has a negative sign ($\alpha=-1$), are similar to expressions (1) through (4). Specifically, in determining whether the currently detected bit $V_p=1$ (binary one), the following expressions are utilized and implemented by the logic circuitry 38:

$$\text{Is } X \geq V_{TT} \tag{5}$$

$$\text{Are } X>0 \text{ and } Y>0 \text{ and } Z>0 \tag{6}$$

If one or both of the expressions (5) and (6) are satisfied, then $V_p=1$.

Similar to the first set of algorithms, the following expression is analyzed:

$$\text{Is } X \leq 0 \tag{7}$$

If expression (7) is satisfied, then $V_p=0$. Likewise also, the following expression is analyzed:

$$\text{Is } 0 < X < V_{TT} \tag{8}$$

If expression (8) is satisfied, then $V_k=0$.

The expressions (1), (2), (5) and (6) are also utilized and implemented in the afore-described prior art Schneider article. It is believed that the expressions (1), (3), (4), (5), (7) and (8) are similar to equations identified as (13) in the afore-described prior art Wood article; however, no testing or verification has been done to determine the degree of similarity.

Referring again to FIG. the apparatus also includes a control unit 46 for determining whether data is being read or whether non-data information is being read. If data is not being read or not about to immediately be read, the Viterbi decoder with run-length code constraint logic circuitry 38 is controlled so that expressions (2) and (6) are not solved and the logic circuitry associated therewith is not utilized. Non-data information does not have the embedded code constraint and, when read, this part of the logic circuitry 38 should not be utilized in order to properly read the non-data information. As previously indicated, such non-data information could include tones or marks that indicate the start or presence of a data record on magnetic tape. If the expressions (2), (6) were utilized for non-data information, inaccurate reading thereof would result.

On the other hand, the control unit 46 outputs a run-length enable signal whenever data is being read having the code constraint. The control unit 46 reads and analyzes the binary related information then being read by the magnetic reading assembly 14. The control unit 46 is configured to recognize the data pattern or code associated with the non-data information, such as the tones or marks. Upon recognition, a run-length enable signal is outputted by the control unit 46 and applied to the Viterbi decoder logic circuitry 38. This signal enables or allows the logic circuits associated with expressions (2) and (6) to be utilized or activated in determining the binary state of the detected bit $V_p$. In one embodiment, a series of binary ones acts as a preamble and indicates that a data record is imminent and the run-length enable signal is outputted by the control unit 46.

OPERATION

Figure 3A:
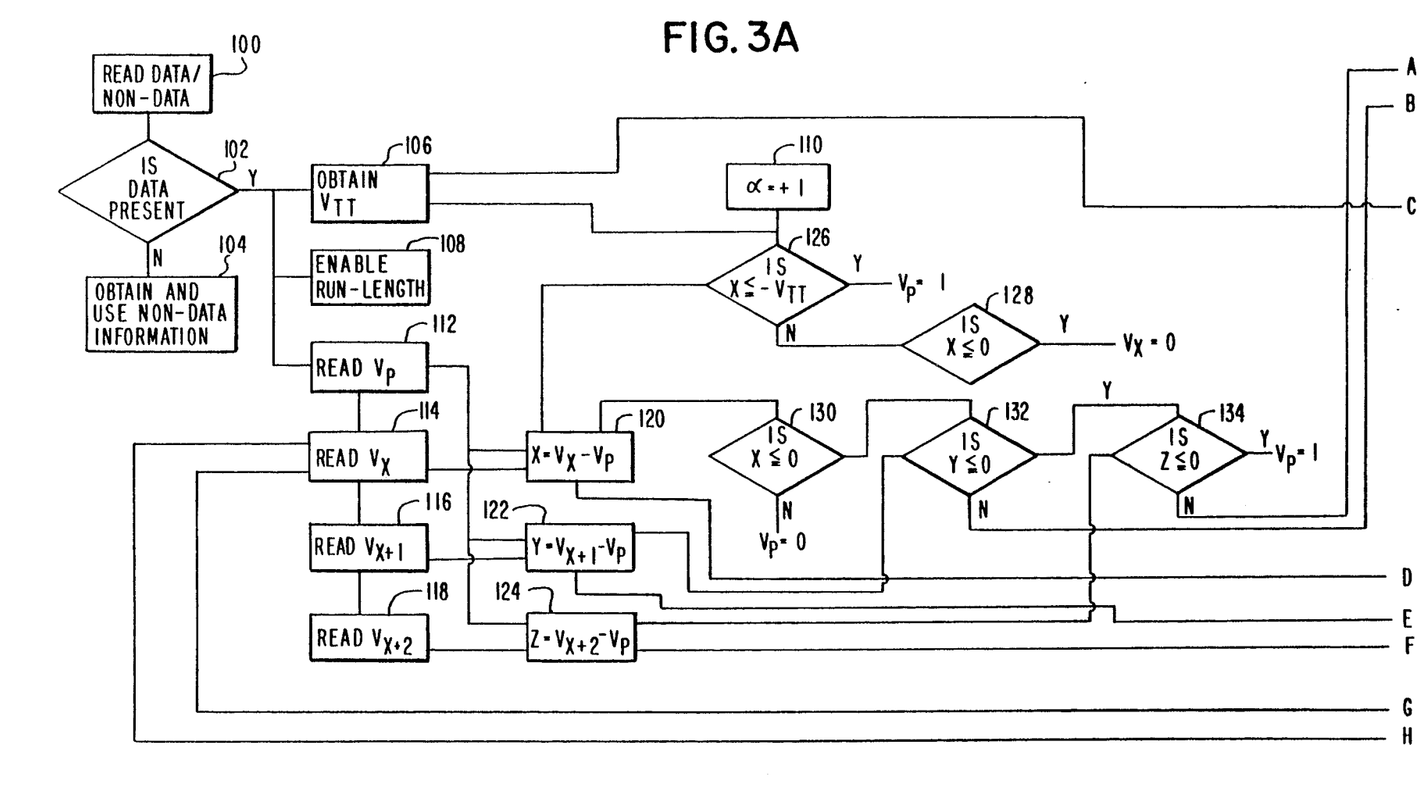
FIGS. 3A-3B are flow diagrams illustrating the steps associated with the decoding of data using the modified Viterbi decoder having the run-length limited code (0,3)
Figure 3B:
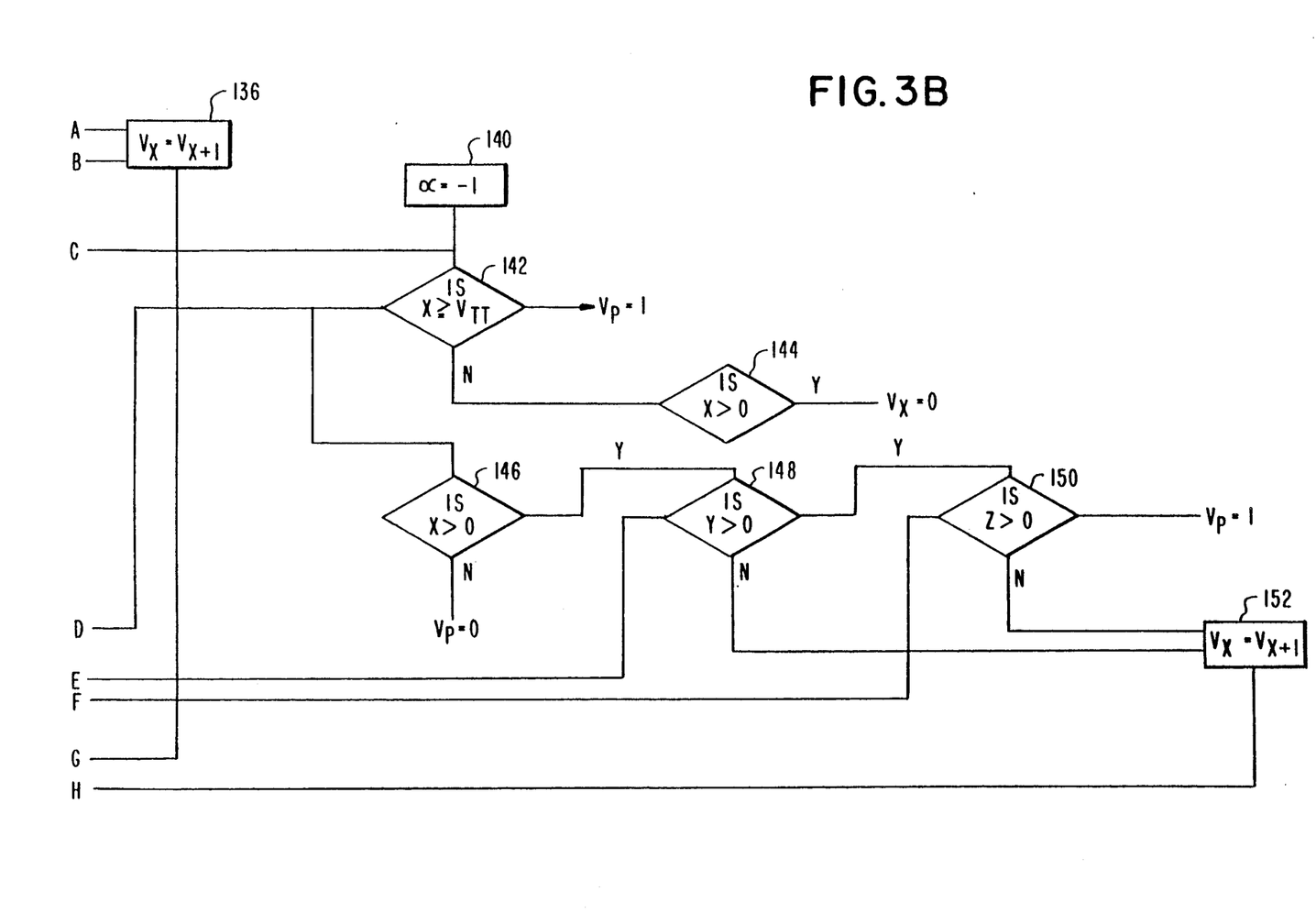
Figure 4:
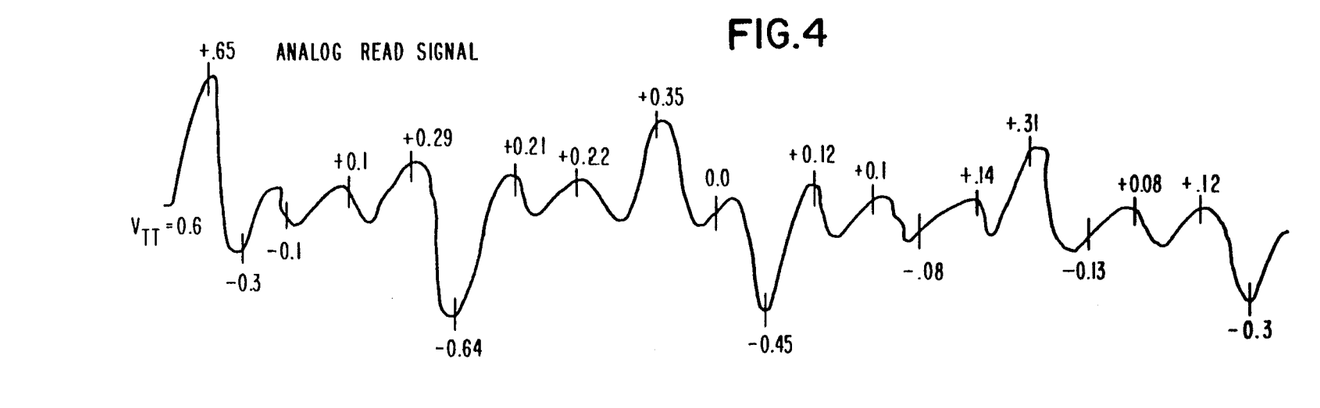
FIG. 4 is an example of an analog read signal that is generated when reading data, having a code constraint of (0,3), that is stored on magnetic tape.
Figure 5:
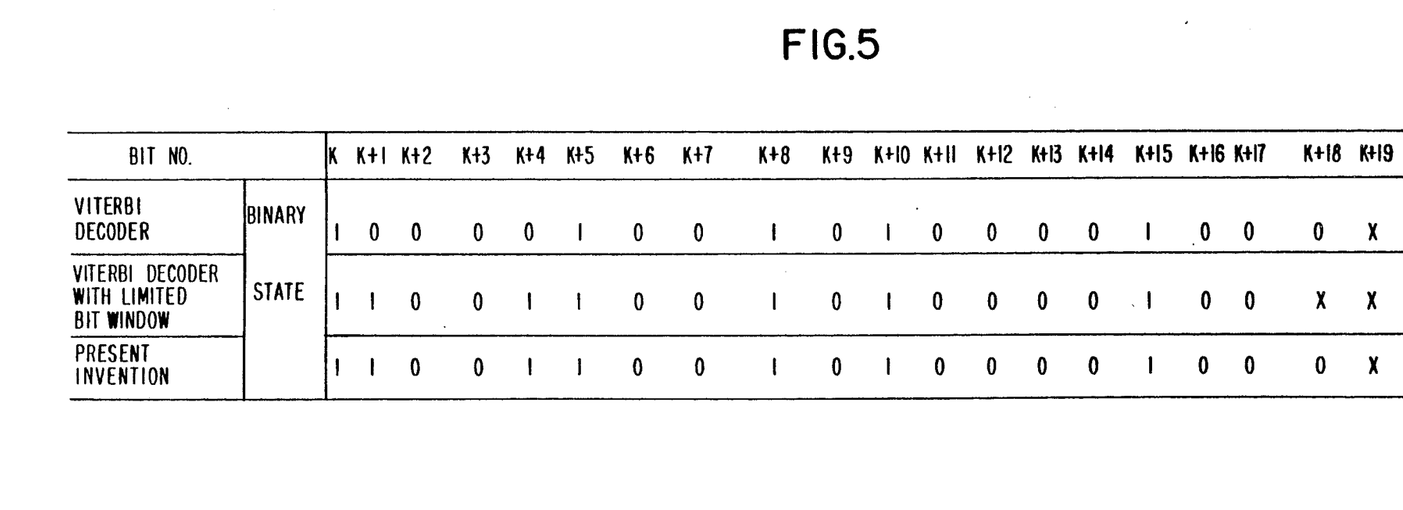
FIG. 5 is a chart illustrating a comparison among the Viterbi decoder of the present invention that does not include the run-length code constraint, a Viterbi decoder of the prior art that limits bits used in analyzing a detected bit and the modified Viterbi decoder of the present invention.

With reference to FIGS. 3-5, the operation of the Viterbi decoder with run-length code constraint logic circuitry 38 will be discussed. FIGS. 3A-3B are flow diagrams that illustrate the logic associated with implementing the logic circuitry and from which the appropriate logic gates for implementing the same can be devised or identified.

In conjunction with the description of the flow diagram, it will be explained using data examples relying on the illustrations found in FIGS. 4 and 5. With respect to a first example, the feature of utilizing different $V_k$ bits will be discussed.

FIG. 4 illustrates an example of an analog read signal generated by reading at 100 (FIG. 3) binary bits stored on the storage device 10. The bits are represented by voltage values found substantially at the peaks of the analog signal. With respect to data bits that have been read and determined as being data bits at 102, they are identified in FIG. 5 as k, k+1 ... k+19. Each of the k values is vertically aligned with one of the bits identified as being at a peak or substantially near a peak of the analog signal represented in FIG. 4. When non-data information is being read, it is analyzed or otherwise used in accordance with step 104. A voltage value for $V_{TT}$ has also been designated in FIG. 4, namely: $V_{TT}=0.6$. In a first example, the binary state of the bit identified as k+11 will be determined. Referring to FIG. 3A, the k+11 bit is read and based on a previous determination that data is present, the tracking threshold $V_{TT}$ is obtained at 106 and the enable run-length signal is generated at 108 to enable use of the code constraint, namely, (0.3) in this example. Due to the previous monitoring, it is known that the next binary one is to have a positive polarity ($\alpha=+1$) at 110. Continuing with the steps of FIG. 3A, the k+11 bit is read and becomes $V_p=+0.12$ at 112. The $V_k$, $V_{k+1}$ and $V_{k+2}$ bits, which are the next successive bits, are also read, i.e.: $V_k=+0.1$ at 114; $V_{k+1}=-0.08$ at 116; and $V_{k+2}=+0.14$ at 118. Using $V_k=+0.1$ and $V_p=-0.12$, X is determined at 120. Using $V_{k+1}-0.08$ and $V_p$, Y is determined at 122. Using $V_{k+2}=+0.14$, together with $V_p$, Z is determined at 124. That is:

$$X=0.1-0.12=-0.02$$

$$Y=-0.08-0.12=-0.2$$

$$Z=0.14-0.12=0.02$$

From these Values, it is determined:
Is $X \leq -V_{TT}$ i.e., Is $-0.02 \leq -0.6$. Since $-0.02$ is not less than or equal to $-0.6$, the expression is not satisfied at 126 and it cannot be determined that $V_p=1$. At 128 it is determined:

Is $-V_{TT}X \leq 0$, i.e., Is $-0.6 < -0.02 \leq 0$. Because this expression is satisfied, $V_k=0$. A determination is made at 130, 132, 134:

Are $X \leq 0$ and $Y \leq 0$ and $Z \leq 0$, i.e., Are $-0.02 \leq 0$ and $-0.2 \leq 0$ and $0.02 \leq 0$. Since $Z=0.02$ is not less than or equal to zero, the combination of expressions at 130, 132, 134 is not satisfied and it cannot be determined that $V_p=1$. Additionally, because $X=-0.02$, which is less than zero, it cannot be determined at 130 that $V_p=0$.

With this analysis completed, it has been determined that $V_k=0$ but no determination has been made as to the binary state of $V_p$. Next, in determining the binary state of $V_p$, $V_k$ is now updated to be $V_{k+1}$, $V_{k+1}$ is updated to become $V_{k+2}$ and $V_{k+2}$ is updated to become $V_{k+3}$ at 136. In the present example, this means that $V_k$ becomes $k+13$, $V_{k+1}$ becomes $k+14$ and $V_{k+2}$ becomes $k+15$. Conducting the steps to determine X, Y and Z at 120, 122 and 124, respectively, results in:

$$X=-0.08-0.12=-0.2$$

$$Y=0.14-0.12=0.02$$

$$Z=0.31-0.12=0.19$$

Applying these values in accordance with the next steps of the flow diagram, with $\alpha=+1$, it is determined:

Is $X \leq -V_{TT}$, i.e., Is $-0.2 \leq -0.6$. Since the result is not satisfied at 126, no decision can be made that $V_p=1$.

Is $-V_{TT} < X \leq 0$, i.e., Is $-0.6 < -0.2 \leq 0$. Since this expression is satisfied at 128, $V_k=0$. Thus, the bit k+13 of the example has a binary state $=0$.

Continuing with the expressions of 130, 132 and 134:
Are $X \leq 0$, i.e., $-0.2 \leq 0$ and $Y=0$, i.e., $0.02 \leq 0$ and $Z \leq 0$, i.e., $0.19 \leq 0$. Since neither Y nor Z are less than or equal to 0 and X is less than 0, no determination can be made concerning the binary state of the currently detected $V_p$ bit (k+11 bit).

Next, as before, the previous $V_k$ is updated to become $V_{k+1}$. In the example, $V_k$ becomes k+14 and then $V_{k+1}$ becomes k+15 and $V_{k+2}$ becomes k+16. After reading these values, X, Y and Z are determined:

$$X=0.14-0.12=0.02$$

$$Y=0.31-0.12=0.19$$

$$Z=-0.13-0.12=-0.25$$

Continuing on to 126:
Is $X \leq -V_{TT}$, i.e., Is $0.02 \leq -0.6$. Since this expression is not met, no determination can be made as to the binary state of $V_p$ (the k+11 bit). At 128:

Is $-V_{TT} < X \leq 0$, Is $-0.6 < 0.02 \leq 0$. Since this expression is not satisfied, no determination can be made concerning $V_k$ At 130:

Is $X \leq 0$, i.e., Is $0.02 \leq 0$. Since this expression is not satisfied, i.e., X is greater than zero, it is determined that $V_p=0$ at 130.

Now that the designated bit $V_p$ has been determined, the next undetermined bit in the sequence could be determined, namely the k+14 bit. From the foregoing example, it is seen that the present invention utilizes bits that are not immediately in succession to the current bit. In the example, in determining $V_p$ (k+11), bits k+14, k+15 and k+16 were eventually analyzed to determine the binary state of the bit k+11.

With reference to FIG. 5, a further example will be described to compare the present invention with the prior art Schneider solution previously discussed. In this example, the designated bit to be detected ($V_p$) is bit k+17 and therefore:

$V_p = 0.08$; $V_k = 0.12$; $V_{k+1} = -0.3$; and $V_{k+2} =$ unknown (x). Using these values, and it being known that the next binary one has a negative polarity since the last binary one had a positive polarity (k+15 bit), the set of expressions using $\alpha = -1$ at 140 are utilized (FIG. 3B). To obtain the X, Y and Z values, similar to the previous example:

$$X = 0.12 - 0.08 = = 0.04.$$

$$Y = -0.3 - 0.08 = -0.38$$

$$Z = unknown - 0.08 = unknown$$

Using these values, at 142:

Is $X \leq V_{TT}$, i.e., Is 0.04 $\leq$ 0.6. Since this expression is not satisfied, no determination can be made that $V_p$ equals a binary one. At 144:

Is $0 < X < V_{TT}$, i.e., Is $0 < 0.04 < 0.6$. Since this expression is satisfied, $V_k = 0$. In attempting to perform the steps required at 146, 148 and 150, the combination of such steps cannot be implemented because Z is unknown. Since $X = 0.04 > 0$, no determination can be made that $V_p$ is 0. From the foregoing, it is seen that the binary state of a bit can be determined without using all of the $V_p$, $V_k$, $V_{k+1}$ and $V_{k+2}$ bits. This determination is contrasted with that of the prior art, as disclosed in the afore-described Schneider article and which is identified in the chart of FIG. 5 as the Viterbi decoder with limited bit window. Using that implementation, given the information in the chart, no determination can be made concerning the binary state of the k+18 bit.

In addition, the combination of Viterbi decoder and code constraint logic circuitry 38 is able to determine the binary states of two different bits while conducting the steps for one set of algorithms. For example, let the current bit being detected $V_p$ be the k+15 bit. In such a case, it is known that a positive binary one is the next binary one to be detected so that $\alpha = +1$ at 110. With $V_p = k+15 = 0.31$, $V_k = k+16 = -0.13$; $V_{k+1} = k+17 = 0.08$; and $V_{k+2} = k+18 = -012$. Usng these values:

$$X = -0.13 - 0.31 = -0.43$$

$$Y = 0.08 - 0.31 = -0.23$$

$$Z = 0.12 - = -0.19$$

At 126:

Is $X \leq -V_{TT}$, i.e., Is $-043 - 0.6$, Since this expression is not satisfied, it cannot be determined that $V_p$ equals a binary one. At 128:

Is $-V_{TT} < X \leq = 0$, i.e., Is $-0.6 < -0.43 \leq 0$. Since this expression is satisfied, $V_k = 0$. At 130:

Are $X \leq 0$, i.e., Is $0.43 \leq 0$ and $Y \leq 0$, i.e, Is $-0.23 \leq 0$ and $Z \leq 0$, i.e., Is $-0.19 \leq 0$. Since each of these three expressions is satisfied, $V_p = 1$. The binary state of the $V_p$ bit (k+15) bit and the binary state of the $V_k$ bit (k+16) bit have both been determined, with the k+15 bit being a binary one and the k+16 bit being a binary zero.

A further example compares the present invention with an implementation that does not include a code constraint but utilizes only Viterbi algorithms. In this example, $V_p = k+1$ bit. Therefore, $V_p = -0.3$; $V_k = -0.1$; $V_{k+1} = 0.2$; and $V_{k+2} = 0.29$. Because the last previous binary one was a positive binary one (k bit), the next binary one to be detected is a negative binary one at 140 of FIG. 3B. Using the foregoing values:

$$X = -0.1 - (-3) = 0.2$$

$$Y = 0.1 - (-0.3) = 0.4$$

$$Z = 0.29 - (-0.3) = 0.59$$

Using the values of X, Y and Z, at 142:

Is $X = \leq -V_{TT}$, i.e., Is $0.2 \leq 0.6$. Since this expression is not satisfied, it cannot be determined that $V_p$ equals a binary one using this expression. At 144:

Is $0 < X < V_{TT}$, i.e., $0.2 < 0.6$. Since this expression is satisfied, the binary state of $V_k = 0$. Using the combination of expressions at 146, 148 at 150:

Are $X > 0$, i.e., $0.2 > 0$ and $Y > 0$, i.e., $0.4 > 0$ and $Z > 0$, i.e, $0.59 > 0$. Since each of these expressions is satisfied, i.e., X, Y and Z are each greater than 0, the binary state of $V_p = 1$. Because of the run-length code constraint implemented at 146, 148, 150, the binary state of one is determined for the k+1 bit. This is in contrast to a strict Viterbi decoder implementation where a binary state of one is not determined. Rather, a binary state of zero would be determined because the additional factor of a code constraint is not utilized. Upon inspection of the analog read signal of FIG. 4, it is apparent that the k+1 bit should have a binary state of one and the logic circuitry 38 achieves this anticipated result, whereas a strict Viterbi decoder would inaccurately determine an opposite result. This inaccuracy would be carried on to the next expected binary one, since the classic Viterbi decoder would still be expecting a binary one having a negative $\alpha$. This inaccuracy is illustrated in the k+4 bit of the chart of FIG. 5.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiment described hereinabove is further intended to explain the best mode presently known of practicing the invention and to enable others skilled in the art to utilize the invention in such, or other embodiments, and with the various modifications required by their particular applications or uses of the invention. It is intended that the appended claims be construed to include alternative embodiments to the extent permitted by the prior art.

What is claimed is:

1. A method for decoding data using a combination of Viterbi detection and a run-length code constraint, comprising:

obtaining data comprising a number of bits from a storage device; and determining a binary state of a first bit using a combination of Viterbi detection means and run-length code constraint means having a code constraint defined as (d,k), where k is a predetermined value equal to the maximum number of bits of a first bindary state that are found in a data record between two consecutive bits of the other binary state d, said step of determining including using a second bit to determine said binary state of said first bit, with said second bit being obtained after said first bit and in which said second bit occurs greater than k bits after said first bit.

2. A method for decoding data using a combination of Viterbi detection and a run-length code constraint, comprising:

obtaining data comprising a number of bits from a storage device; and determining a binary state of a first bit using a combination of Viterbi detection means and run-length code constraint means having a code constraint defined as (d,k), where k is a predetermined value equal to the maximum number of bits of a first binary state that are formed in a data record between two consecutive bits of the other binary state d, said step of determining including determining a binary state of another bit, different from said first bit, during said step of determining said binary state of said first bit.

3. A method, as claimed in claim 2, wherein:

said step of determining includes using a number of bits less than k in determining said another bit.

4. A method, as claimed in claim 1, wherein:

said values of (d,k) correspond to (0,3) and said number of bits obtained equals at least third enough fifth bits, with each of said third through fifth bits being consecutively obtained after said first and second bits, and wherein said step of determining includes using said fifth bit in determining said binary state of said first bit.

5. A method, as claimed in claim 1, wherein said step of determining includes enabling said run-length code constraint means when determining said binary state of said first bit and not enabling said run-length code constraint means when obtaining non-data information.

6. A method, as claimed in claim 1, wherein:

said step of determining includes using a tracking threshold that relates to a binary state of at least said first bit.

7. A method, as claimed in claim 1, wherein:

said step of determining includes determining the difference between a value relating to said first bit and a value relating to a bit obtained after said first bit and using said difference in determining said binary state of said first bit.

8. A method, as claimed in claim 7, wherein said step of determining includes determining a relationship associated with said difference and a predetermined magnitude.

9. A method, as claimed in claim 8, wherein:

said predetermined magnitude equals zero and said step of determining a relationship includes comparing said difference with zero.

10. A method, as claimed in claim 7, wherein:

said step of determining includes inputting a tracking threshold and determining a relationship associated with said difference and said tracking threshold.

11. A method, as claimed in claim 10, wherein said step of determining a relationship includes comparing said difference with said tracking threshold and said step of determining includes comparing said difference with zero.

12. A method, as claimed in claim 1, wherein:

said step of determining includes determining the signs of the differences between a value of said first bit and a value of each of a number of consecutive bits that are obtained after said first bit.

13. A method, as claimed in claim 1, wherein:

said step of determining includes determining a binary state of a second bit, which is obtained after said first bit, before determining said binary state of said first bit.

14. A method, as claimed in claim 1, wherein said step of obtaining includes:

reading said data and generating an analog signal representative thereof; and converting said analog signal to a digital signal, wherein said step of determining is conducted using a digital first bit and a number of consecutively read digital bits in determining said binary state of said first bit.

15. An apparatus for decoding data using a combination of Viterbi detection and run-length code constraint, comprising:

first means for providing a number of data bits; and a combination of Viterbi detection means and run-length limited code means responsive to said first means for determining a binary state of a first bit of said number of bits, said combination having a urn-length code constraint defined as (d,k), where k is a predetermined value equal to the maximum number of bits of a first binary state that are found in a data record between two consecutive bits of the other binary state d, said combination determining said first bit binary state by using a second bit that occurs greater than k bits after said first bit.

16. An apparatus, as claimed in claim 15, wherein:

said combination includes magnitude and sign determining circuitry means responsive to said first means for determining a value relating to a difference between said first bit and said second bit.

17. An apparatus, as claimed in claim 16, wherein:

said magnitude and sign determining circuitry means includes means for determining a polarity relating to said first bit and each of third and fourth bits that are provided after said first and second bits.

18. An apparatus, as claimed in claim 15, wherein:

said first means includes means for inputting a tracking threshold to said combination.

19. An apparatus, as claimed in claim 15, further including:

a control unit for outputting an enabling signal to said combination when reading data and not outputting said enabling signal when reading non-data information.

20. An apparatus, as claimed in claim 15, wherein: said first means includes a storage device for storing data represented by bits.

21. An apparatus, as claimed in claim 20, wherein: said storage device includes a magnetic medium.

22. An apparatus, as claimed in claim 21, wherein: said first means includes magnetic means for reading data from said magnetic medium.

23. An apparatus, as claimed in claim 15, wherein: said first means includes means for converting an analog read signal to a digital signal.

* * * * *